United States Patent [19]

Evans

[11] 4,107,602
[45] Aug. 15, 1978

[54] PROBE MEANS UTILIZED WITH A PAIR OF INDICATORS FOR TESTING THE WIRING CONNECTIONS OF A FUSE RECEPTACLE

[76] Inventor: David M. Evans, PSC BOX 5095 APO, San Francisco, Calif. 96519

[21] Appl. No.: 727,817

[22] Filed: Sep. 29, 1976

[51] Int. Cl.² ............................................. G01R 31/02
[52] U.S. Cl. ..................................................... 324/51
[58] Field of Search ............... 324/51, 52, 53, 66, 324/133, 149; 339/108 TP

[56] References Cited

U.S. PATENT DOCUMENTS

| | | | |
|---|---|---|---|
| 396,582 | 1/1889 | Loomis | 324/51 |
| 524,844 | 8/1894 | Smith | 324/51 |
| 988,891 | 3/1911 | Mitchell | 324/51 |
| 1,636,707 | 7/1927 | Robinson et al. | 324/51 |
| 2,186,212 | 1/1940 | Scoggin | 324/51 |
| 2,195,975 | 4/1940 | Ribble et al. | 324/51 X |
| 2,229,927 | 1/1941 | Kamper | 324/51 |
| 2,851,659 | 9/1958 | Ladrick | 324/51 X |
| 3,742,345 | 6/1973 | Lacey | 324/52 |
| 3,771,098 | 11/1973 | Dempsey | 324/51 X |
| 3,820,017 | 6/1974 | Reichenbach | 324/51 |
| 3,898,557 | 8/1975 | Strock | 324/51 |
| 3,973,193 | 8/1976 | Hayes | 324/53 |

*Primary Examiner*—Gerard R. Strecker
*Attorney, Agent, or Firm*—Joseph E. Rusz; William Stepanishen

[57] ABSTRACT

A fuse safety tester apparatus utilizing a pair of neon light bulbs to test the wiring connections of a fuse receptacle in the active power circuit of a unit under test.

5 Claims, 1 Drawing Figure

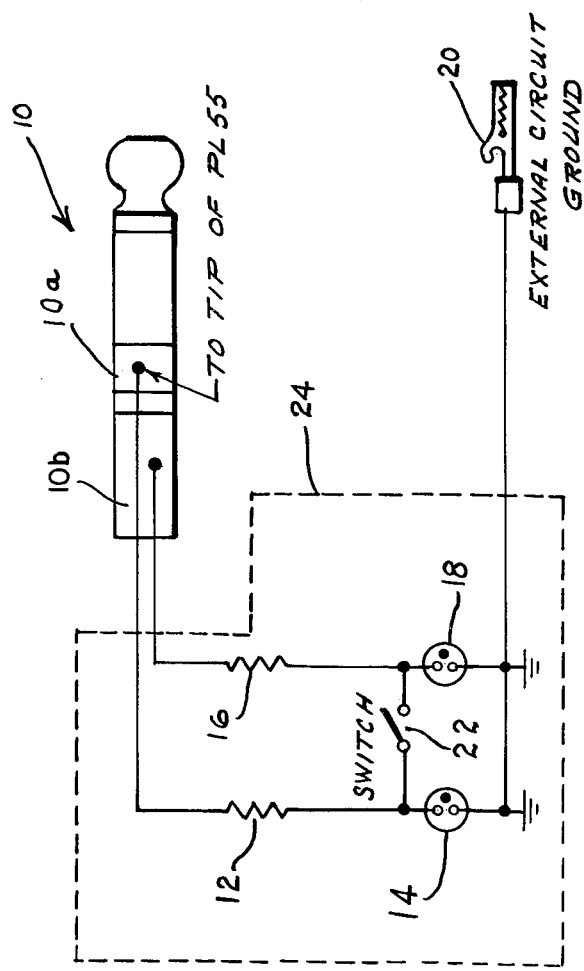

PROBE MEANS UTILIZED WITH A PAIR OF INDICATORS FOR TESTING THE WIRING CONNECTIONS OF A FUSE RECEPTACLE

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to power circuit testing devices, and in particular to a fuse circuit safety tester apparatus.

In the prior art, the wiring of fuse receptacles is checked by having the equipment disconnected from the power source. A ohm meter is then used to measure the continuity between the high side of the power cord and the back of the fuse holder, and also to make sure that there is no continuity to the front of the fuse holder or to ground. A continuity check is made from the low side of the power cord to the front of the fuse holder. Care is taken to insure that there is no continuity to the rear of the fuse holder and to chassis ground. Finally, a check is made for continuity between the ground connector on the power cord and chassis ground. The time consumed and the chance for error is far greater than the check should require. The time which is required for this check can exceed five minutes. The present fuse circuit safety test apparatus provides a highly accurate and efficient testing device which eliminates the prior art insufficiencies.

SUMMARY

The present invention utilizes a two circuit phone plug having a tip contact that is connected to a resistor which is connected to a switch terminal and green light. The side terminal of the plug is connected to another resistor which is connected to switch terminal and a red light. The remaining sides of the two lights are connected to an alligator clip. The tip of the plug engages the hot line of the fuse receptacle, the side of the plug engages the neutral side of the fuse receptacle and the alligator clip is to be connected to an electrical ground.

The fuse circuit safety tester apparatus tests the wiring connection of a fuse receptacle in a unit under test with the power switch on. If the circuit is wired properly the green light will be illuminated and should the wiring be improper, the red light will illuminate, indicating that further action is required.

It is one object of the present invention, therefore, to provide an improved fuse circuit safety tester apparatus permitting wiring checks in a circuit with the power on.

It is another object of the invention to provide an improved fuse circuit safety tester apparatus wherein a visible indication is provided in response to the circuit wiring condition.

It is yet another object of the invention to provide an improved fuse circuit safety tester apparatus wherein the human element for error is substantially eliminated and the time required for the check greatly reduced.

These and other advantages, features and objects of the invention will become more apparent from the following description taken in connection with the illustrative embodiment in the accompanying drawing wherein the FIGURE is a schematic diagram of the fuse circuit safety tester apparatus in accordance with the present invention.

DESCRIPTION OF THE PREFERRED EMBODIMENT

Referring now to the FIGURE, there is shown a schematic diagram of the fuse circuit safety tester apparatus having a tester probe 10 which may be a phone plug of a type such as a PL 55 plug that has a pair of conductive sections, adjacent to each other but electrically insulated therefrom. There is connected by a resistor 12 to the first portion 10a of the tester probe 10, a neon light 14 which includes a lens to provide a green light. The neon light 14 is connected between the resistor 12 and ground to complete the electrical circuit when the fuse safety tester apparatus is in operation. The second portion 10b of the tester probe 10 is connected by a resistor 16 to a second neon light 18 which has a red lens. A ground connection is provided to neon light 18 in order to have a complete electrical circuit when the fuse safety tester apparatus is operated. The ground connection of both neon lights 14, 18 are connected to an alligator clip 20 to provide a connection means to an external equipment under-test ground. The fuse safety tester apparatus further includes a switch 22 which is connected between neon lights 14, 18, that may be neon lights of the type such as an NE-51. The fuse safety tester apparatus may include a metal or plastic box in which the components enclosed by the dash block 24, may be mounted.

The fuse safety tester apparatus is operated in the following manner in conjunction with the unit under test. Before any connection is made to the unit under test, the tester switch 22 is placed in the normally open position and alligator clip 20 is attached to the test unit ground. The fuse in the test unit is removed from the fuse receptacle and the tester probe 10 is inserted into the fuse receptacle. The test unit is now connected to a power source and the test unit power switched on. If the fuse receptacle is wired correctly, the green (safe) light 14 will illuminate, and if the fuse receptacle is wired backwards, the red (unsafe) light 18 will illuminate. The switch on the tester is now closed and both lights will light if the fuse is wired on the high side of the load. If the fuse is on the low side of the load, both lights will be extinguished. After flipping the switch on the tester apparatus, the power light on the piece of equipment under test should also illuminate. The time required to make the test is less than thirty seconds.

Although the invention has been described with reference to a particular embodiment, it will be understood to those skilled in the art that the invention is capable of a variety of alternative embodiments within the spirit and scope of the appended claims.

What is claimed is:

1. A fuse safety tester apparatus comprising in combination:
    a test probe means having a first and second member adjacent to each other, said first member being electrically connected to the tip of said test probe means, said first and second member being electrically insulated from said each other,
    a first indicating means connected to said first member,
    a second indicating means connected to said second member,
    ground means connected to both said first and second indicating means for providing an external circuit ground, said ground means to be connected to the chassis ground of the unit under test, and switch means connected between said first and second indicating means, said switch means being normally open, said test probe means being inserted into the fuse receptacle of the unit under test, said unit under test being connected to its power source, the power switch of said unit under test being in the power on position.

2. A fuse wiring safety tester apparatus as described in claim 1 wherein said test probe is inserted into the fuse receptacle of a test unit to test the wiring connections of said fuse receptacle.

3. A fuse wiring safety tester apparatus as described in claim 1 wherein said first and second indicating means both comprise a series circuit of a resistor and a neon light between test apparatus common ground terminal means and the first and second member, respectively, of said test probe.

4. A fuse wiring safety tester apparatus as described in claim 3 wherein said neon light is a Ne-51 bulb.

5. A fuse wiring safety tester apparatus as described in claim 4 wherein said first indicating means includes a green lens to provide a green visible light and said second indicating means includes a red lens to provide a red visible light.

* * * * *